United States Patent
Zhou et al.

(10) Patent No.: US 9,564,217 B1
(45) Date of Patent: Feb. 7, 2017

(54) SEMICONDUCTOR MEMORY DEVICE HAVING INTEGRATED DOSRAM AND NOSRAM

(71) Applicant: UNITED MICROELECTRONICS CORP., Hsin-Chu (TW)

(72) Inventors: Zhibiao Zhou, Singapore (SG); Chen-Bin Lin, Taipei (TW); Chi-Fa Ku, Kaohsiung (TW); Shao-Hui Wu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/886,116

(22) Filed: Oct. 19, 2015

(51) Int. Cl.
| | |
|---|---|
| H01L 27/10 | (2006.01) |
| H01L 29/04 | (2006.01) |
| H01L 29/24 | (2006.01) |
| H01L 29/66 | (2006.01) |
| H01L 29/78 | (2006.01) |
| G11C 14/00 | (2006.01) |
| H01L 29/786 | (2006.01) |
| H01L 27/108 | (2006.01) |
| H01L 27/105 | (2006.01) |

(52) U.S. Cl.
CPC ....... *G11C 14/0009* (2013.01); *H01L 27/1052* (2013.01); *H01L 27/10808* (2013.01); *H01L 27/10855* (2013.01); *H01L 27/10873* (2013.01); *H01L 27/10897* (2013.01); *H01L 29/045* (2013.01); *H01L 29/24* (2013.01); *H01L 29/66477* (2013.01); *H01L 29/66969* (2013.01); *H01L 29/78* (2013.01); *H01L 29/7869* (2013.01)

(58) Field of Classification Search
CPC .......... H01L 27/1052; H01L 27/10808; H01L 27/10855; H01L 27/10873; H01L 27/10897; H01L 29/045; H01L 29/24; H01L 29/66477; H01L 29/66969; H01L 29/78; H01L 29/7869
See application file for complete search history.

(56) References Cited

U.S. PATENT DOCUMENTS

| | | | |
|---|---|---|---|
| 6,972,451 B2 | 12/2005 | Delpech | |
| 6,977,198 B2 | 12/2005 | Gau | |
| 7,534,692 B2 | 5/2009 | Jagueneau | |
| 7,675,768 B1 * | 3/2010 | Kim | B82Y 10/00 365/149 |
| 8,780,614 B2 | 7/2014 | Takemura | |
| 9,293,598 B2 * | 3/2016 | Yamazaki | H01L 29/7869 |
| 9,316,695 B2 * | 4/2016 | Takahashi | G01R 31/3613 |
| 9,431,435 B2 * | 8/2016 | Ando | H01L 27/1255 |
| 9,431,441 B1 * | 8/2016 | Zhou | H01L 27/14612 |
| 2009/0303801 A1 * | 12/2009 | Kim | B82Y 10/00 365/189.05 |

(Continued)

*Primary Examiner* — Ida M Soward
(74) *Attorney, Agent, or Firm* — Winston Hsu; Scott Margo

(57) ABSTRACT

A semiconductor memory device includes a semiconductor substrate having a main surface, at least a first dielectric layer on the main surface of the semiconductor substrate, a first OS FET device and a second OS FET device disposed on the first dielectric layer, at least a second dielectric layer covering the first dielectric layer, the first OS FET device, and the second OS FET device, a first MIM capacitor on the second dielectric layer and electrically coupled to the first OS FET device, and a second MIM capacitor on the second dielectric layer and electrically coupled to the second OS FET device.

9 Claims, 14 Drawing Sheets

(56) References Cited

U.S. PATENT DOCUMENTS

| | | | | |
|---|---|---|---|---|
| 2010/0061137 A1* | 3/2010 | Kim | ......................... | G11C 7/06 |
| | | | | 365/102 |
| 2011/0053332 A1* | 3/2011 | Lee | ..................... | H01L 21/2007 |
| | | | | 438/381 |
| 2014/0325249 A1* | 10/2014 | Toyotaka | ........... | G11C 14/0018 |
| | | | | 713/323 |
| 2015/0255490 A1* | 9/2015 | Miyairi | ............... | H01L 27/1207 |
| | | | | 257/43 |
| 2015/0270270 A1* | 9/2015 | Kato | ................ | H01L 29/78648 |
| | | | | 257/43 |

\* cited by examiner

SEMICONDUCTOR MEMORY DEVICE HAVING INTEGRATED DOSRAM AND NOSRAM

BACKGROUND OF THE INVENTION

1. Field of the Invention

The present invention relates generally to a semiconductor memory device, and more particularly, to a semiconductor memory device having integrated dynamic oxide semiconductor random access memory (hereinafter DOSRAM) and non-volatile oxide semiconductor random access memory (hereinafter NOSRAM). A method of making such semiconductor memory device is also disclosed.

2. Description of the Prior Art

Semiconductor memory is an electronic data storage device, often used as computer memory, implemented on a semiconductor-based integrated circuit. It is made in many different types and technologies. Semiconductor memory has the property of random access, which means that it takes the same amount of time to access any memory location, so data can be efficiently accessed in any random order.

One type of memory is dynamic random access memory (DRAM). DRAM is dynamically accessible. In DRAM, memory is stored for a short period of time, typically less than a second, and accordingly DRAM requires periodic refreshing. DRAM loses memory when power is off or fails, and accordingly is volatile. DRAM may be accessed and altered quickly.

Another type of memory is static random access memory (SRAM). SRAM may be accessible faster than DRAM, may store memory permanently as long as power is present, and thus may not require refreshing like DRAM. SRAM, like DRAM, loses memory when power is off, and accordingly is also volatile.

While DRAM traditionally utilizes unit cells containing a transistor and a capacitor, SRAM unit cells comprise six transistors, and therefore the cell size for SRAM is much larger than that for DRAM. In high-performance electronic systems, SRAM may be used for instruction storage, while DRAM is used for working memory and short-term data storage.

Still another type of memory is nonvolatile memory (NVM). NVM is memory that stores data without refreshing, and accordingly memory suitable for storing data for substantial lengths of time (for instance, 10 years) in the absence of power.

Both DRAM and NVM offer advantageous and disadvantages. DRAM is fast, but the volatility of DRAM leads to data loss once power is turned off, and the refreshing of DRAM consumes power. NVM is stable in the absence of power, but tends to be slower to program than DRAM. Also, NVM often utilizes higher programming voltages than DRAM, which lowers the endurance of NVM relative to DRAM.

It is desirable to provide a semiconductor memory device and a fabrication method thereof, which are able to integrate high-density DRAM and low-leakage NVM embedded in one chip.

SUMMARY OF THE INVENTION

It is one object of the invention to provide an improved semiconductor memory device having integrated DOSRAM and NOSRAM, which can be implemented on one single chip.

According to one aspect of the invention, a semiconductor memory device includes a semiconductor substrate having a main surface, at least a first dielectric layer on the main surface of the semiconductor substrate, a first oxide semiconductor field effect transistor (OS FET) device disposed on the first dielectric layer, a second OS FET device disposed on the first dielectric layer, at least a second dielectric layer covering the first dielectric layer, the first OS FET device, and the second OS FET device, a first metal-insulator-metal (MIM) capacitor on the second dielectric layer and electrically coupled to the first OS FET device, thereby constituting a dynamic oxide semiconductor random access memory (DOSRAM) cell, and a second MIM capacitor on the second dielectric layer and electrically coupled to the second OS FET device, thereby constituting a non-volatile oxide semiconductor random access memory (NOSRAM) cell.

According to one aspect of the invention, a method for fabricating a semiconductor memory device is provided. A semiconductor substrate having a main surface is prepared. At least a first dielectric layer is formed on the main surface of the semiconductor substrate. A first OS FET device and a second OS FET device are formed on the first dielectric layer. At least a second dielectric layer is formed to cover the first dielectric layer, the first OS FET device, and the second OS FET device. A first MIM capacitor and a second MIM capacitor are formed on the second dielectric layer. The first MIM capacitor is electrically coupled to the first OS FET device, thereby constituting a DOSRAM cell. The second MIM capacitor is electrically coupled to the second OS FET device, thereby constituting a NOSRAM cell.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The terms "wafer" or "substrate" used herein includes any structure having an exposed surface onto which a layer is deposited according to the present invention, for example, to form the integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "inter-layer dielectric (ILD)" used herein includes any dielectric material for isolating metal interconnections. Therefore, it is also used to refer to "inter-metal dielectric (IMD)" or "passivation layer" as well as other dielectric structures well known to one skilled in the art.

Two kinds of memories utilizing oxide semiconductor transistors will be described. Here, the memories are referred to as "DOSRAM" and "NOSRAM". "DOSRAM" stands for a dynamic oxide semiconductor random access memory. "NOSRAM" stands for a non-volatile oxide semiconductor random access memory. Memory cells of a DOSRAM and a NOSRAM each include an oxide semiconductor transistor as a selection transistor of the memory cell (a transistor as a switching element).

The following detailed description is, therefore, not to be taken in a limiting sense, and the scope of the present invention is defined only by the appended claims, along with the full scope of equivalents to which such claims are entitled.

Figure 1:
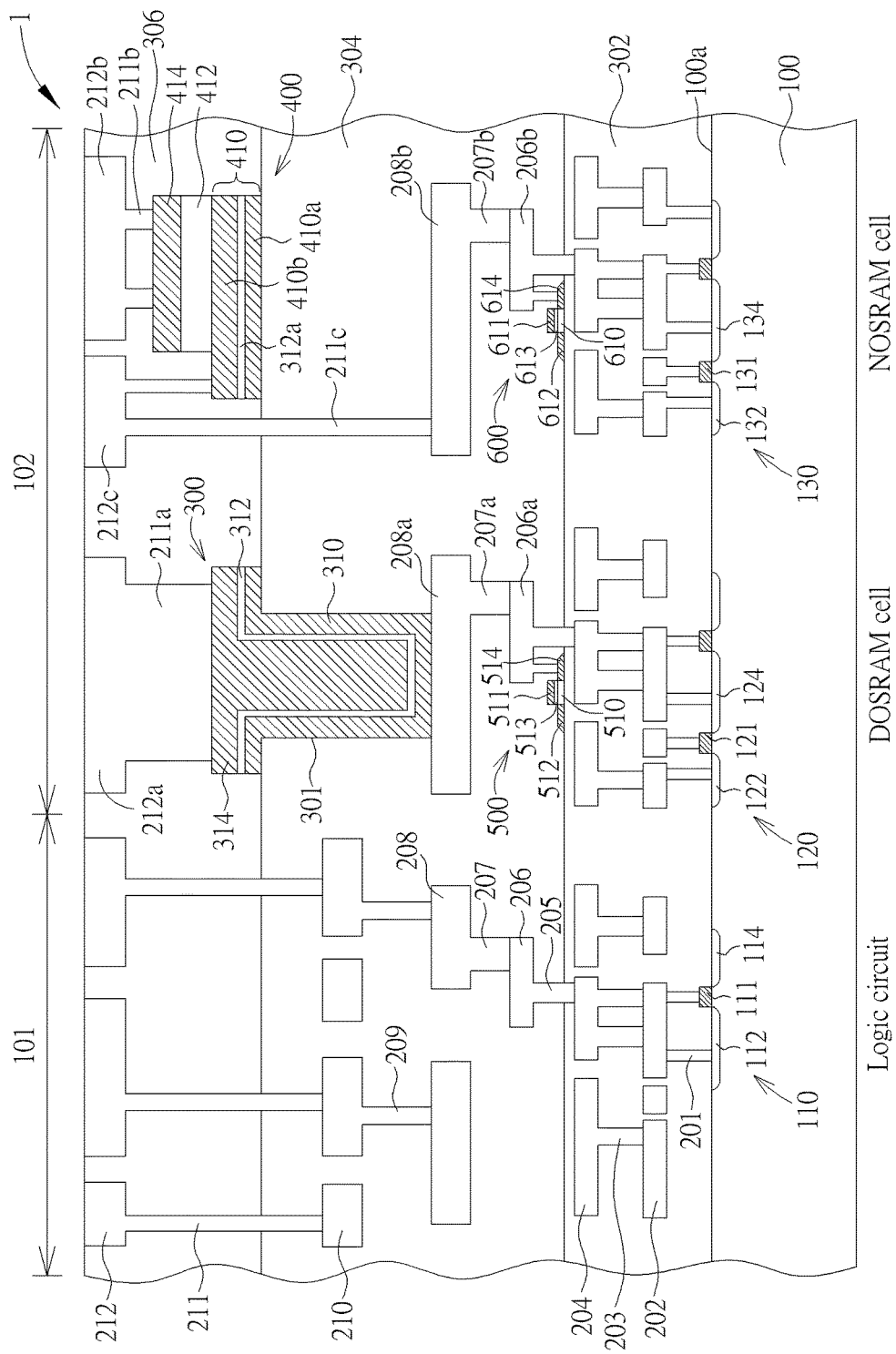
FIG. 1 is a schematic, cross-sectional diagram showing a semiconductor memory device having integrated DOSRAM and NOSRAM according to one embodiment of the invention.

FIG. 1 is a schematic, cross-sectional diagram showing a semiconductor memory device having integrated DOSRAM and NOSRAM according to one embodiment of the invention. As shown in FIG. 1, a semiconductor memory device 1 comprises a substrate 100 having a main surface 100a. The substrate 100 may include a semiconductor substrate, a semiconductor epitaxial layer deposited or otherwise formed on a semiconductor substrate and/or any other type of semiconductor body, and all such structures are contemplated as falling within the scope of the present invention.

For example the semiconductor substrate may include a semiconductor wafer (e.g., silicon, SiGe, or silicon-on-insulator (SOI) wafer) or one or more die on a wafer, and any epitaxial layers or other type semiconductor layers formed thereon or associated therewith. A portion or entire semiconductor substrate may be amorphous, polycrystalline, or single-crystalline. Additionally, the semiconductor substrate may be doped, undoped or contain doped regions and undoped regions therein. Also, the semiconductor substrate may contain regions with strain stress and regions without strain therein, or contain regions of tensile strain stress and compressive strain stress.

According to the embodiment of the invention, the substrate 100 comprises a logic circuit region 101 (or peripheral circuit region) and a memory region 102. The memory region 102 may further include a DOSRAM cell region and a NOSRAM cell region. At least a silicon field effect transistor (Si FET) device 110 such as a metal-oxide-semiconductor field-effect-transistor (MOS FET) device is formed on and in the main surface 100a of the substrate 100 within the logic circuit region 101. For example, the Si FET device 110 may comprise a gate 111, a source/drain doping region 112, and a source/drain doping region 114. At least a Si FET device 120 and at least a Si FET device 130 may be formed on and in the main surface 100a of the substrate 100 within the memory region 102. For example, the Si FET device 120 may comprise a gate 121, a source/drain doping region 122, and a source/drain doping region 124, and the Si FET device 130 may comprise a gate 131, a source/drain doping region 132, and a source/drain doping region 134.

According to the embodiment of the invention, the main surface 100a of the substrate 100, and the Si FET devices 110, 120, 130 are covered with a first dielectric layer 302. A plurality of metal interconnection features including, but not limited to, contact plugs 201, metal wiring layers 202 and 204, and via plugs 203, are formed within the first dielectric layer 302. The first dielectric layer 302 may comprise a single inter-layer dielectric (ILD) film or multiple ILD films including, but not limited to, silicon oxide, silicon nitride, silicon oxynitride, PSG, BPSG, ultra-low k dielectric, etc. The terminals of the Si FET devices 110, 120, 130 may be electrically connected to the metal wiring layers 202 and 204 through the contact plugs 201. According to the embodiment of the invention, the metal wiring layers 202 and 204, and via plugs 203 may be formed by copper damascene techniques, but not limited thereto.

According to the embodiment of the invention, first and second oxide semiconductor field effect transistor (OS FET) devices 500 and 600 are disposed on the first dielectric layer 302. According to the embodiment of the invention, the first OS FET device 500 may comprise a gate electrode 511, a source electrode 512, and a drain electrode 514. The gate electrode 511 traverses a channel material layer 510. A gate dielectric layer 513 is disposed between the gate electrode 511 and the channel material layer 510. According to the embodiment of the invention, the second OS FET device 600 may comprise a gate electrode 611, a source electrode 612, and a drain electrode 614. The gate electrode 611 traverses a channel material layer 610. A gate dielectric layer 613 is disposed between the gate electrode 611 and the channel material layer 610.

The first and second OS FET devices 500 and 600 have excellent electric characteristics of an extremely small off-state current. According to the embodiment of the invention, the channel material layers 510 and 610 may comprise an oxide semiconductor (OS) material layer. For example, the OS material layer preferably comprises In—Ga—Zn oxide (IGZO) or c-axis aligned crystalline oxide semiconductor (CAAC-OS) materials. The gate electrodes 511, 611, the source electrode 512, 612 and the drain electrode 514, 614 of the first and second OS FET devices 500, 600 may include metal materials.

According to the embodiment of the invention, the OS material layer may include, but not limited to, indium oxide, tin oxide, zinc oxide, two-component metal oxide such as In—Zn-based oxide, Sn—Zn-based oxide, Al—Zn-based oxide, Zn—Mg-based oxide, Sn—Mg-based oxide, In—Mg-based oxide, or In—Ga-based oxide, three-component metal oxide such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—

Tm—Zn-based oxide, In—Yb—Zn-based oxide, or In—Lu—Zn-based oxide, four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, or In—Hf—Al—Zn-based oxide.

According to the embodiment of the invention, the first and second OS FET devices 500, 600 and the first dielectric layer 302 is covered with a second dielectric layer 304. The second dielectric layer 304 may comprise a single ILD film or multiple ILD films including, but not limited to, silicon oxide, silicon nitride, silicon oxynitride, PSG, BPSG, ultra-low k dielectric, etc. A plurality of metal interconnection features including, but not limited to, metal wiring layers 206, 208, 210, and via plugs 205, 207, 209, are formed within the second dielectric layer 304. According to the embodiment of the invention, the metal wiring layers 206, 208, 210, and via plugs 205, 207, 209 may be formed by copper damascene techniques, but not limited thereto.

According to the embodiment of the invention, the semiconductor memory device 1 further comprises a first metal-insulator-metal (MIM) capacitor 300 fabricated on the second dielectric layer 304. According to the embodiment of the invention, the first MIM capacitor 300 comprises a bottom plate (BP) 310 in a capacitor trench 301, a high-k dielectric layer 312 on the BP 310, and a top plate (TP) 314 on the high-k dielectric layer 312. For example, the BP 310 of the first MIM capacitor 300 may be electrically coupled to the drain electrode 514 of the first OS FET device 500 through at least the metal layer 206a and 208a, and the via plugs 205a and 207a, thereby constituting a dynamic oxide semiconductor random access memory (DOSRAM) cell. The TP 314 may be electrically connected to a metal wiring layer 212a through a via plug 211a. It is understood that the semiconductor memory device 1 may comprise multiple DOSRAM cells. For the sake of simplicity, only one DOSRAM cell is demonstrated.

According to the embodiment of the invention, the BP 310 and the TP 314 may comprise titanium nitride (TiN) or tungsten (W), but not limited thereto. According to the embodiment of the invention, the high-k dielectric layer 312 may comprise $Al_2O_3$, $HfO_x$, $ZrO_x$, $BaTiO_x$, or $ZrO_2$—$Al_2O_3$—$ZrO_2$ (ZAZ), wherein x represents as any possible stoichiometric values, but not limited thereto.

According to the embodiment of the invention, the semiconductor memory device 1 further comprises a second MIM capacitor 400 on the second dielectric layer 304. According to the embodiment of the invention, the second MIM capacitor 400 comprises a composite BP 410 on the second dielectric layer 304, a low-leakage dielectric layer 412 on the composite BP 410, and a TP 414 on the low-leakage dielectric layer 412. According to the embodiment of the invention, the composite BP 410 is a flat plate electrode. The first and second MIM capacitors 300 and 400 and the second dielectric layer 304 are covered with a third dielectric layer 306.

According to the embodiment of the invention, the composite BP 410 comprises an electrically floating first metal layer 410a, a high-k dielectric layer 312a on the first metal layer 410a, and a second metal layer 410b on the high-k dielectric layer 312a. According to the embodiment of the invention, the high-k dielectric layer 312a may comprise $Al_2O_3$, $HfO_x$, $ZrO_x$, $BaTiO_x$, or $ZrO_2$—$Al_2O_3$—$ZrO_2$ (ZAZ), but not limited thereto. According to the embodiment of the invention, the low-leakage dielectric layer 412 may comprise $SiO_2$, SiON, SiN, or oxide-nitride-oxide (ONO), but not limited thereto. The first metal layer 410a and the second metal layer 410b may comprise TiN or W, but not limited thereto.

For example, the composite BP 410 of the second MIM capacitor 400 may be electrically coupled to the drain electrode 614 of the second OS FET device 600 through at least the metal layer 206b, 208b, and 212c, and the via plugs 205b, 207b, and 211c, thereby constituting a non-volatile oxide semiconductor random access memory (NOSRAM) cell. The TP 414 may be electrically connected to a metal wiring layer 212b through a via plug 211b. It is understood that the semiconductor memory device 1 may comprise multiple NOSRAM cells. For the sake of simplicity, only one NOSRAM cell is demonstrated.

Figure 2:
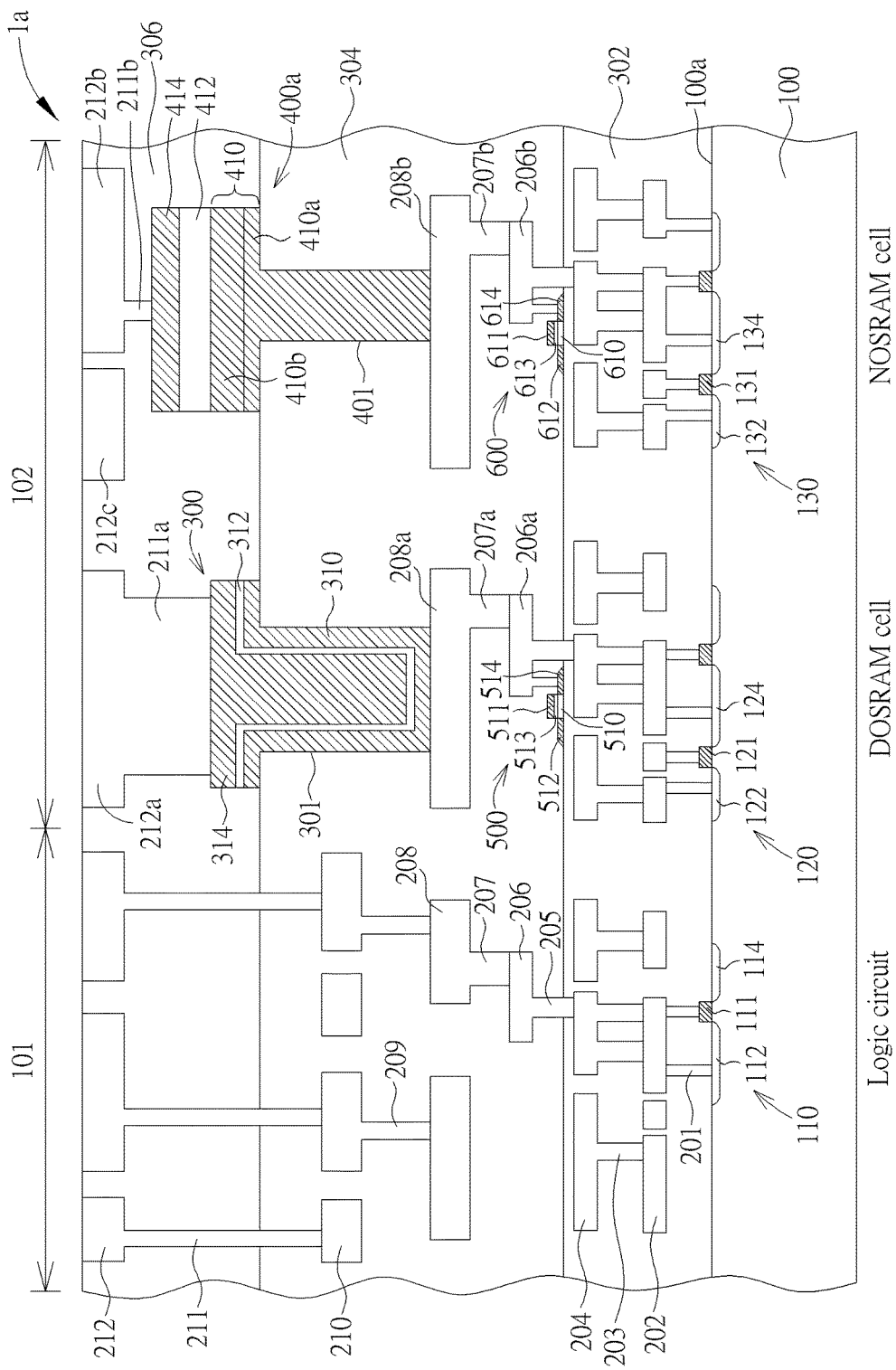
FIG. 2 is a schematic, cross-sectional diagram showing a semiconductor memory device having integrated DOSRAM and NOSRAM according to another embodiment of the invention.

FIG. 2 is a schematic, cross-sectional diagram showing a semiconductor memory device 1a having integrated DOSRAM and NOSRAM according to another embodiment of the invention, wherein like layers, regions, or elements are designate by like numeral numbers. As shown in FIG. 2, the semiconductor memory device 1a is different from the semiconductor memory device 1 of FIG. 1 in that the NOSROM cell of the semiconductor memory device 1a comprises a second MIM capacitor 400a on the second dielectric layer 304. According to the embodiment of the invention, the second MIM capacitor 400a comprises a composite BP 410 on the second dielectric layer 304, a low-leakage dielectric layer 412 on the composite BP 410, and a TP 414 on the low-leakage dielectric layer 412.

According to the embodiment of the invention, the composite BP 410 comprises a first metal layer 410a and a second metal layer 410b on the first metal layer 410a. The second metal layer 410b is formed within a capacitor trench 401. The first metal layer 410a is in direct contact with the second metal layer 410b. The first metal layer 410a is electrically connected to the metal layer 208b that is electrically connected to the second OS FET device 600.

Figure 3:
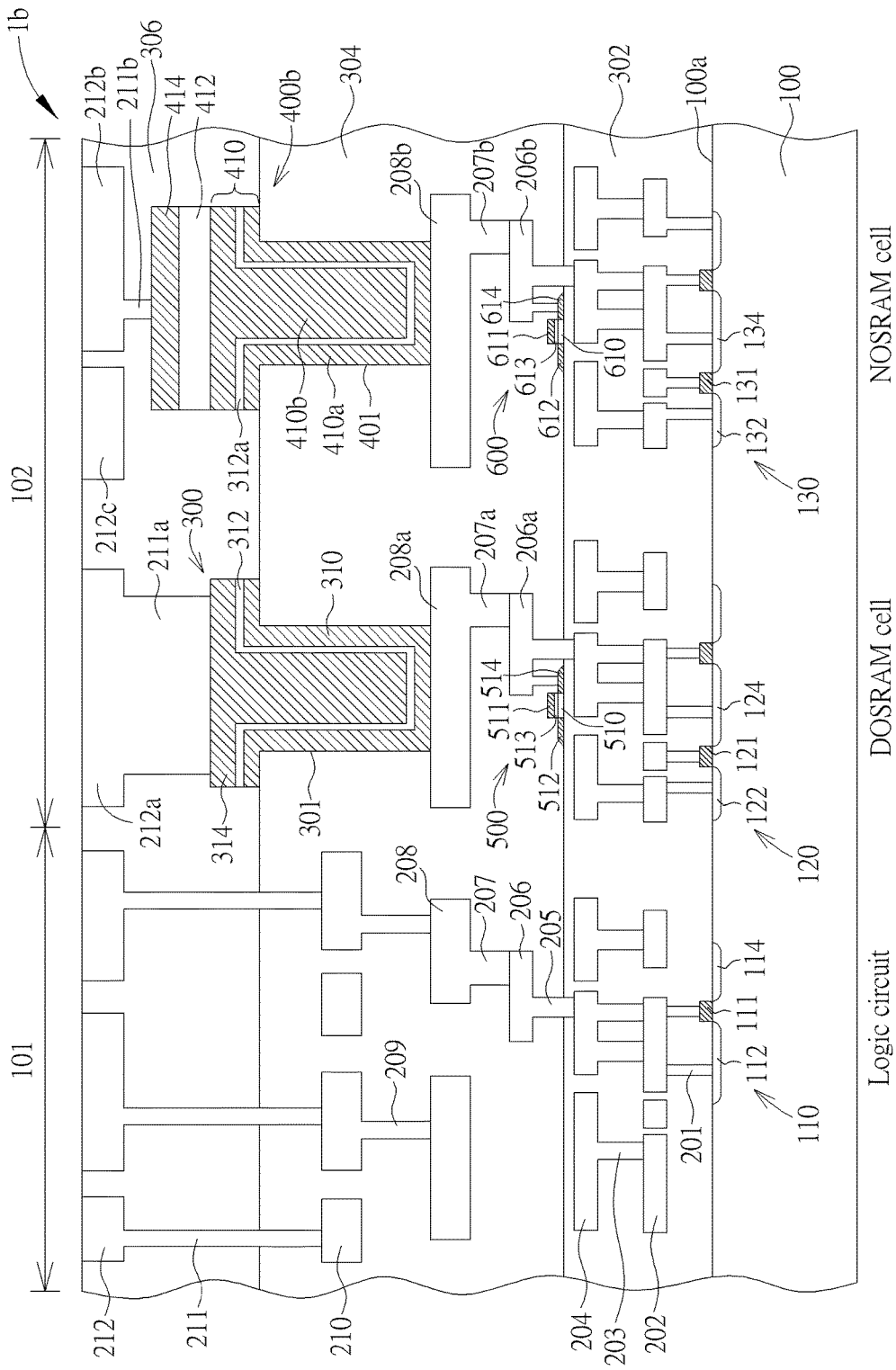
FIG. 3 is a schematic, cross-sectional diagram showing a semiconductor memory device having integrated DOSRAM and NOSRAM according to still another embodiment of the invention.

FIG. 3 is a schematic, cross-sectional diagram showing a semiconductor memory device 1b having integrated DOSRAM and NOSRAM according to still another embodiment of the invention, wherein like layers, regions, or elements are designate by like numeral numbers. As shown in FIG. 3, the semiconductor memory device 1b is different from the semiconductor memory device 1 of FIG. 1 in that the NOSROM cell of the semiconductor memory device 1b comprises a second MIM capacitor 400b on the second dielectric layer 304. According to the embodiment of the invention, the second MIM capacitor 400b comprises a composite BP 410 on the second dielectric layer 304, a low-leakage dielectric layer 412 on the composite BP 410, and a TP 414 on the low-leakage dielectric layer 412.

According to the embodiment of the invention, the composite BP 410 comprises a first metal layer 410a, a high-k dielectric layer 312a on the first metal layer 410a, and an electrically floating second metal layer 410b on the high-k dielectric layer 312a. According to the embodiment of the invention, the high-k dielectric layer 312a may comprise $Al_2O_3$, $HfO_x$, $ZrO_x$, $BaTiO_x$, or $ZrO_2$—$Al_2O_3$—$ZrO_2$ (ZAZ), but not limited thereto. According to the embodiment of the invention, the low-leakage dielectric layer 412 may comprise $SiO_2$, SiON, SiN, or oxide-nitride-oxide (ONO), but not limited thereto. According to the embodiment of the invention, the composite BP 410 is formed within a capacitor trench 401, rather than a flat plate electrode. The first metal layer 410a is electrically connected to the metal layer 208b that is electrically connected to the second OS FET device 600.

Figure 4:
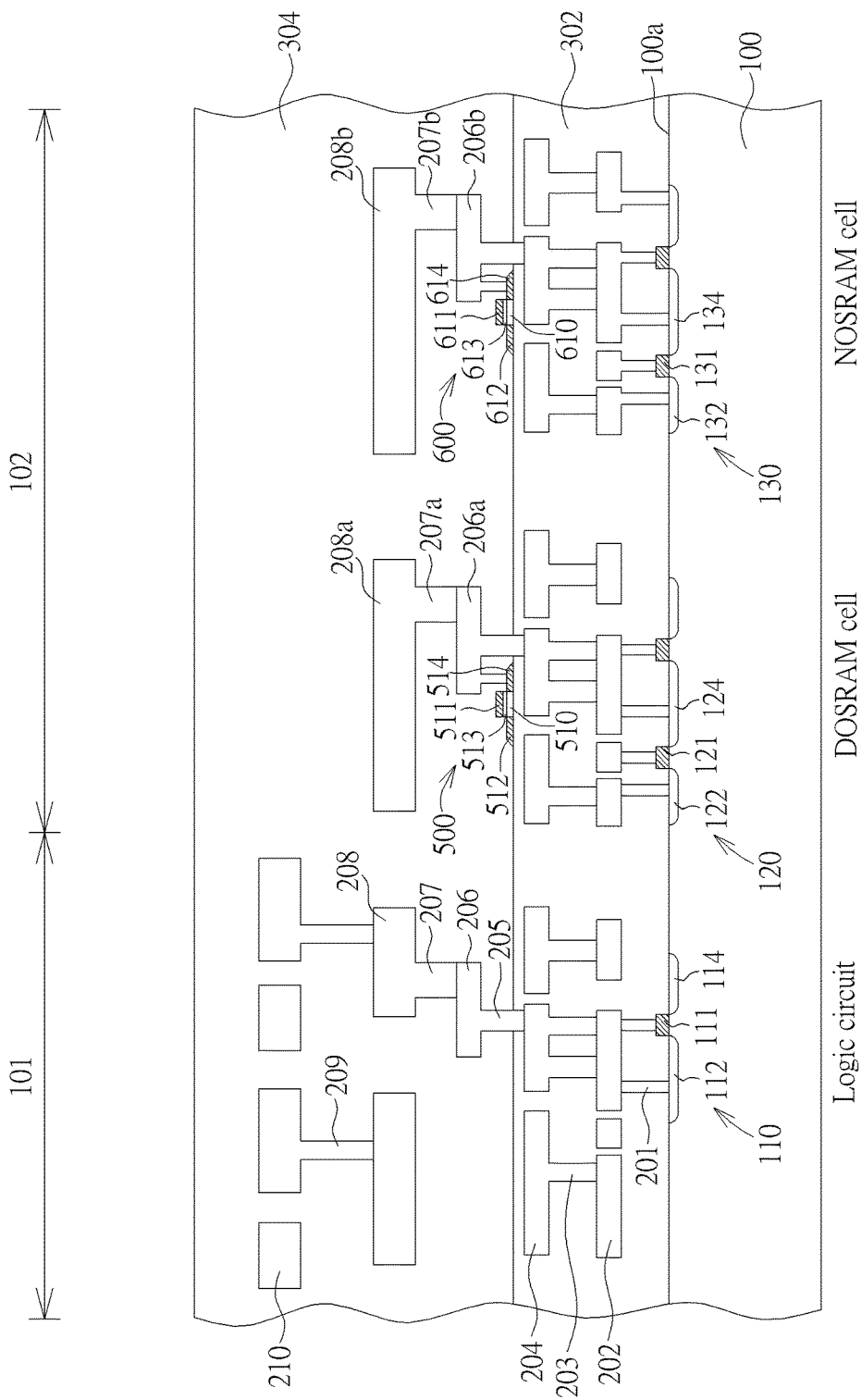
FIG. 4 to FIG. 9 are schematic, cross-sectional diagrams showing an exemplary method for fabricating the semiconductor memory device depicted in FIG. 1 according to one embodiment of the invention.

Please refer to FIG. 4 to FIG. 9. FIG. 4 to FIG. 9 are schematic, cross-sectional diagrams showing an exemplary method for fabricating the semiconductor memory device 1 in FIG. 1 according to one embodiment of the invention. As shown in FIG. 4, a substrate 100 having a main surface 100a is provided. The substrate 100 may include a semiconductor substrate, a semiconductor epitaxial layer deposited or otherwise formed on a semiconductor substrate and/or any other type of semiconductor body.

According to the embodiment of the invention, the substrate 100 comprises a logic circuit region 101 (or peripheral circuit region) and a memory region 102. At least a Si FET device 110 such as a MOS FET device is formed on and in the main surface 100a of the substrate 100 within the logic circuit region 101. For example, the Si FET device 110 may comprise a gate 111, a source/drain doping region 112, and a source/drain doping region 114. At least a Si FET device 120 and at least a Si FET device 130 may be formed on and in the main surface 100a of the substrate 100 within the memory region 102. For example, the Si FET device 120 may comprise a gate 121, a source/drain doping region 122, and a source/drain doping region 124, and the Si FET device 130 may comprise a gate 131, a source/drain doping region 132, and a source/drain doping region 134.

According to the embodiment of the invention, the main surface 100a of the substrate 100, and the Si FET devices 110, 120, 130 are covered with a first dielectric layer 302. A plurality of metal interconnection features including, but not limited to, contact plugs 201, metal wiring layers 202 and 204, and via plugs 203, are formed within the first dielectric layer 302. The first dielectric layer 302 may comprise a single ILD film or multiple ILD films including, but not limited to, silicon oxide, silicon nitride, silicon oxynitride, PSG, BPSG, ultra-low k dielectric, etc. The terminals of the Si FET devices 110, 120, 130 may be electrically connected to the metal wiring layers 202 and 204 through the contact plugs 201. According to the embodiment of the invention, the metal wiring layers 202 and 204, and via plugs 203 may be formed by copper damascene techniques, but not limited thereto.

According to the embodiment of the invention, first and second OS FET devices 500 and 600 are formed on the first dielectric layer 302. According to the embodiment of the invention, the first OS FET device 500 may comprise a gate electrode 511, a source electrode 512, and a drain electrode 514. The gate electrode 511 traverses a channel material layer 510. A gate dielectric layer 513 is disposed between the gate electrode 511 and the channel material layer 510. According to the embodiment of the invention, the second OS FET device 600 may comprise a gate electrode 611, a source electrode 612, and a drain electrode 614. The gate electrode 611 traverses a channel material layer 610. A gate dielectric layer 613 is disposed between the gate electrode 611 and the channel material layer 610.

The first and second OS FET devices 500 and 600 have excellent electric characteristics of an extremely small off-state current. According to the embodiment of the invention, the channel material layers 510 and 610 may comprise an OS material layer. For example, the OS material layer preferably comprises In—Ga—Zn oxide (IGZO) or c-axis aligned crystalline oxide semiconductor (CAAC-OS) materials. The gate electrodes 511, 611, the source electrode 512, 612 and the drain electrode 514, 614 of the first and second OS FET devices 500, 600 may include metal materials.

According to the embodiment of the invention, the OS material layer may include, but not limited to, indium oxide, tin oxide, zinc oxide, two-component metal oxide such as In—Zn-based oxide, Sn—Zn-based oxide, Al—Zn-based oxide, Zn—Mg-based oxide, Sn—Mg-based oxide, In—Mg-based oxide, or In—Ga-based oxide, three-component metal oxide such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide, four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, or In—Hf—Al—Zn-based oxide.

According to the embodiment of the invention, the first and second OS FET devices 500, 600 and the first dielectric layer 302 is covered with a second dielectric layer 304. The second dielectric layer 304 may comprise a single ILD film or multiple ILD films including, but not limited to, silicon oxide, silicon nitride, silicon oxynitride, PSG, BPSG, ultra-low k dielectric, etc. A plurality of metal interconnection features including, but not limited to, metal wiring layers 206, 208, 210, and via plugs 205, 207, 209, are formed within the second dielectric layer 304. According to the embodiment of the invention, the metal wiring layers 206, 208, 210, and via plugs 205, 207, 209 may be formed by copper damascene techniques, but not limited thereto.

Figure 5:
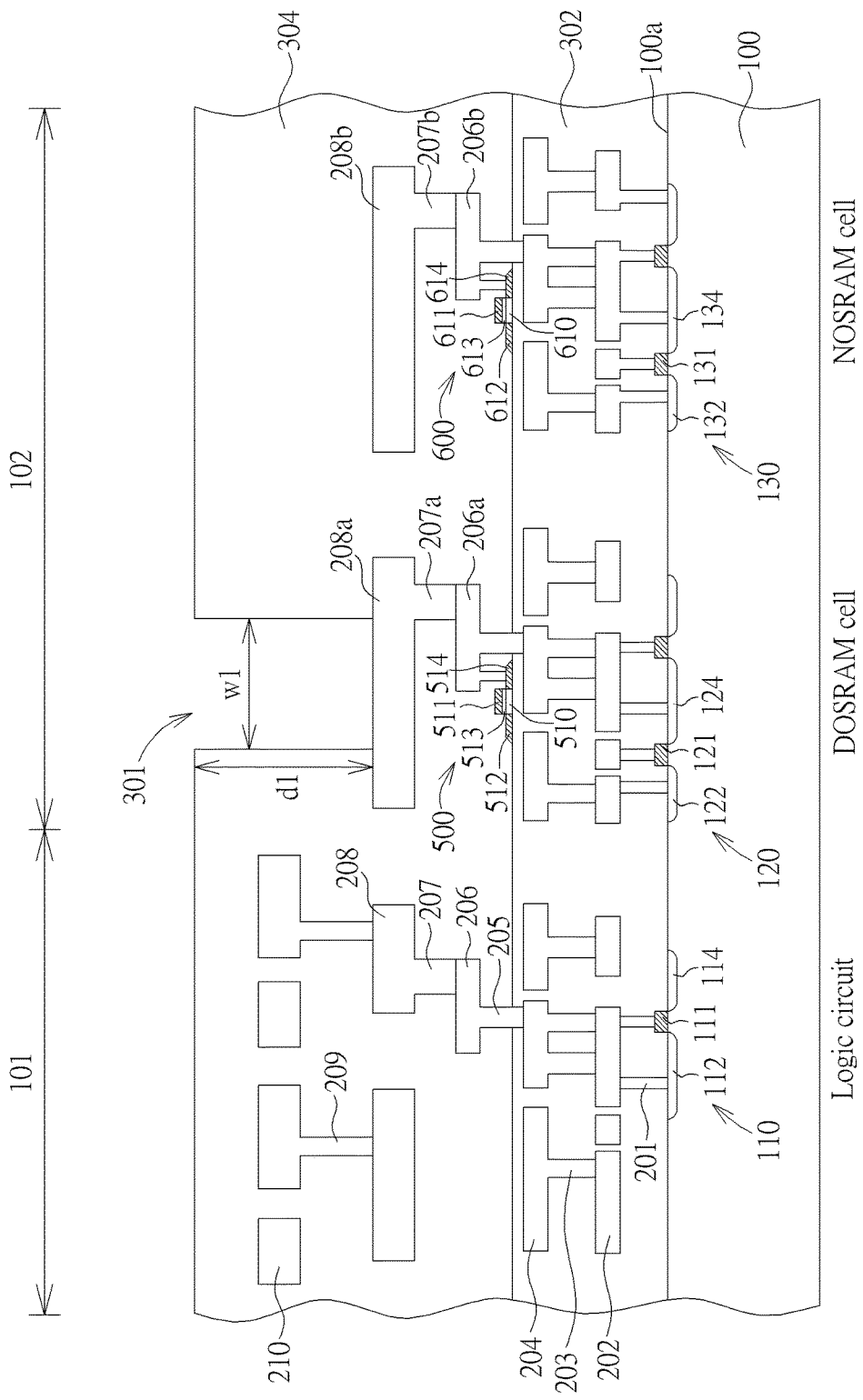

As shown in FIG. 5, a capacitor trench 301 is formed in the second dielectric layer 304. The capacitor trench 301 may be formed by using lithographic processes and etching processes known in the art. The capacitor trench 301 partially exposes a top surface of the metal layer 208a. According to the embodiment of the invention, the capacitor trench 301 may have a width $w_1$ of about 100 nanometers and a depth $d_1$ of about 500~1000 nanometers. According to the embodiment of the invention, the capacitor trench 301 may have an aspect ratio ($d_1/w_1$) of about 5~10, but not limited thereto.

Figure 6:
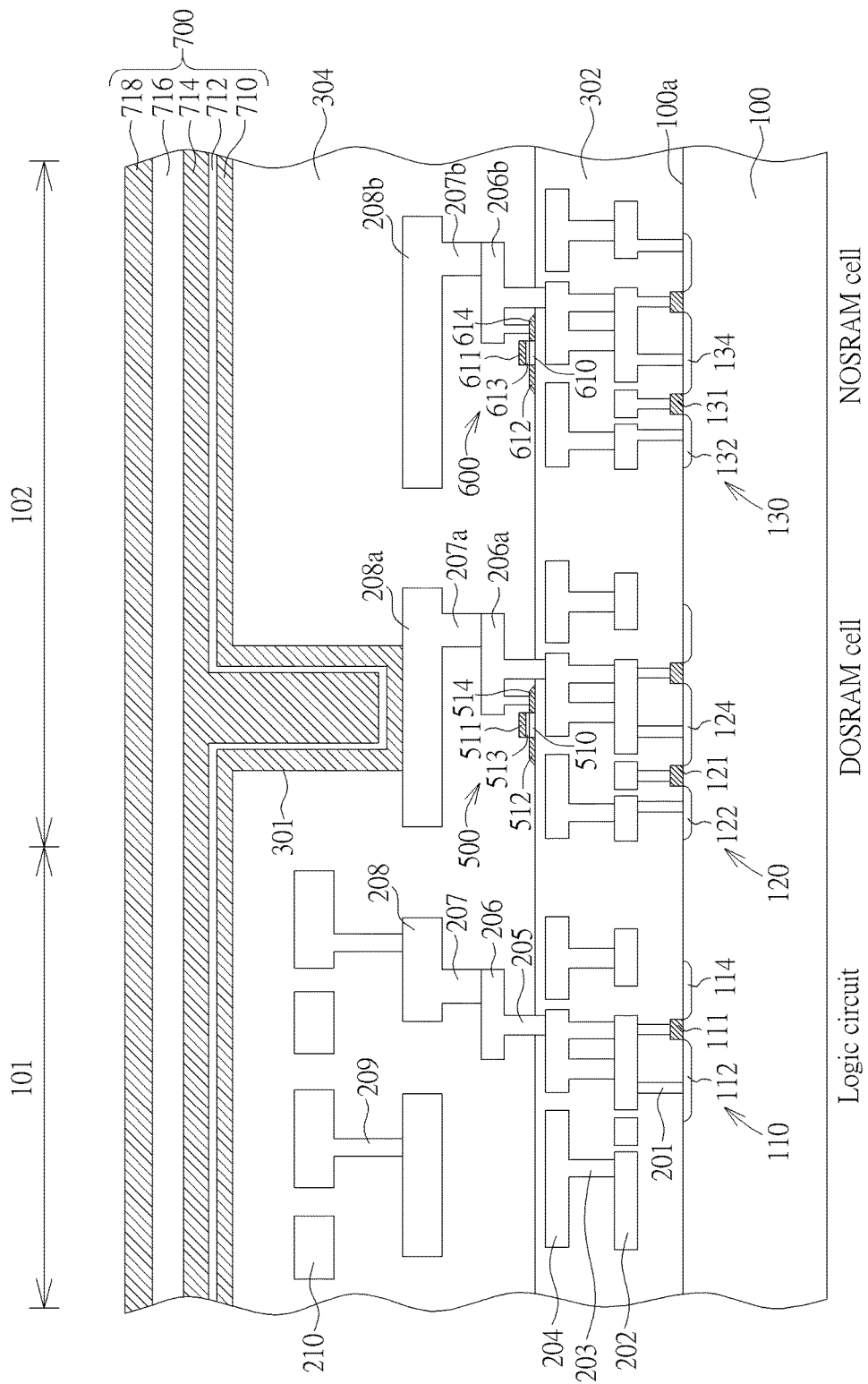

As shown in FIG. 6, a capacitor film stack 700 is formed. For example, a first metal layer 710 is conformally deposited on the second dielectric layer 304 and in the capacitor trench 301. The first metal layer 710 may comprise TiN or W, but not limited thereto. The first metal layer 710 may be formed by atomic layer deposition (ALD), chemical vapor deposition (CVD), or any suitable methods. Subsequently, a high-k dielectric layer 712 may be conformally deposited on the first metal layer 710. For example, the high-k dielectric layer 712 may comprise $Al_2O_3$, $HfO_x$, $ZrO_x$, $BaTiO_x$, or $ZrO_2$—$Al_2O_3$—$ZrO_2$ (ZAZ), but not limited thereto. Subsequently, a second metal layer 714 is deposited on the high-k dielectric layer 712. For example, the second metal layer 714 may comprise TiN or W, but not limited thereto. The second metal layer 714 may be formed by ALD, CVD, or any suitable methods.

According to the embodiment of the invention, the first metal layer 710, the high-k dielectric layer 712, and the second metal layer 714 completely fill up the capacitor trench 301. A low-leakage dielectric layer 716 is then deposited on the second metal layer 714. The low-leakage dielectric layer 716 may comprise $SiO_2$, SiON, SiN, or ONO, but not limited thereto. A third metal layer 718 is deposited on the low-leakage dielectric layer 716. For example, the third metal layer 718 may comprise TiN or W, but not limited thereto. The third metal layer 718 may be formed by ALD, CVD, or any suitable methods.

Figure 7:
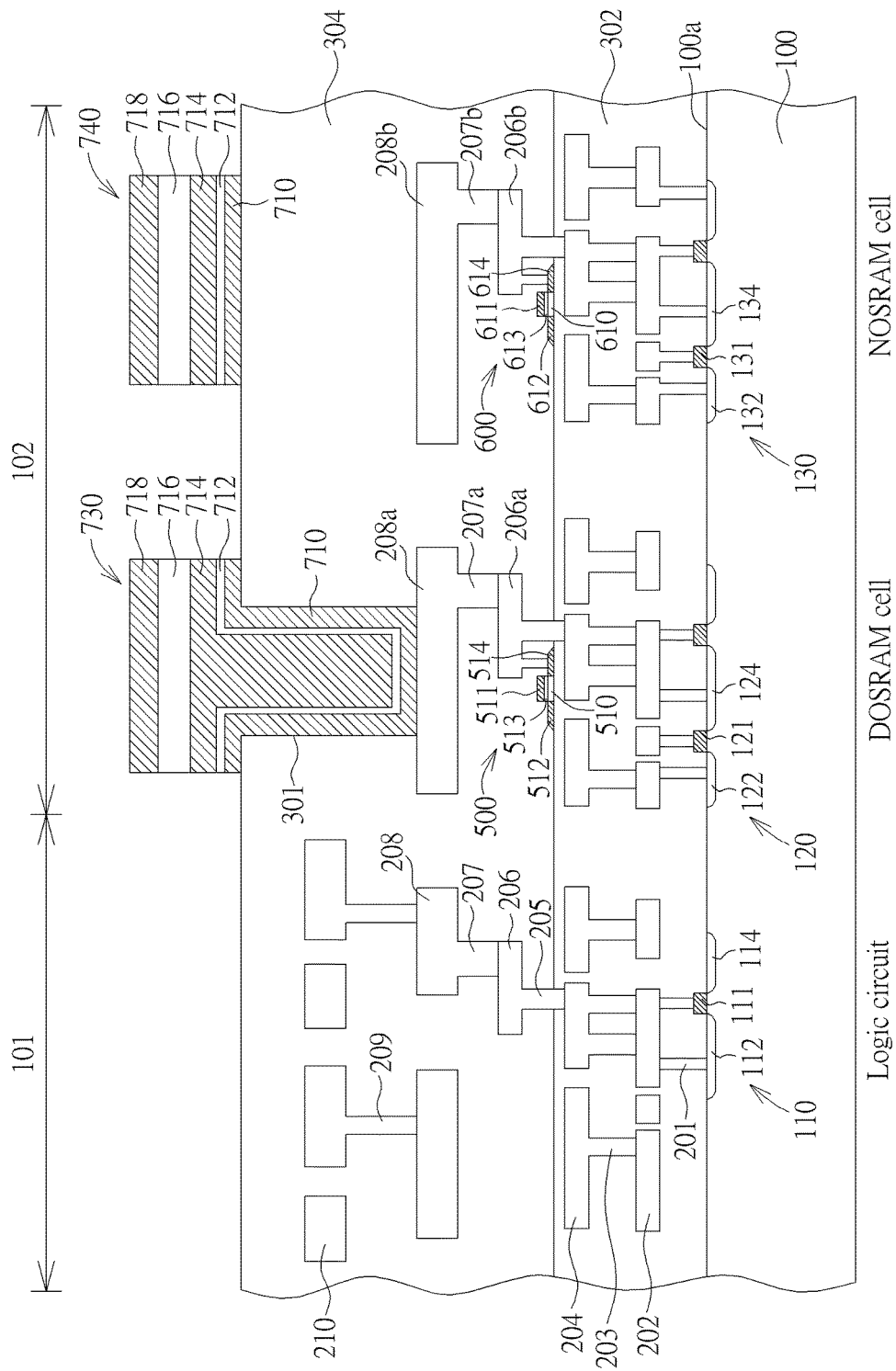

As shown in FIG. 7, a lithographic process and an etching process are carried out. A portion of the capacitor film stack 700 is removed to thereby form capacitor pattern 730 and capacitor pattern 740 on the second dielectric layer 304 within the memory region 102.

Figure 8:
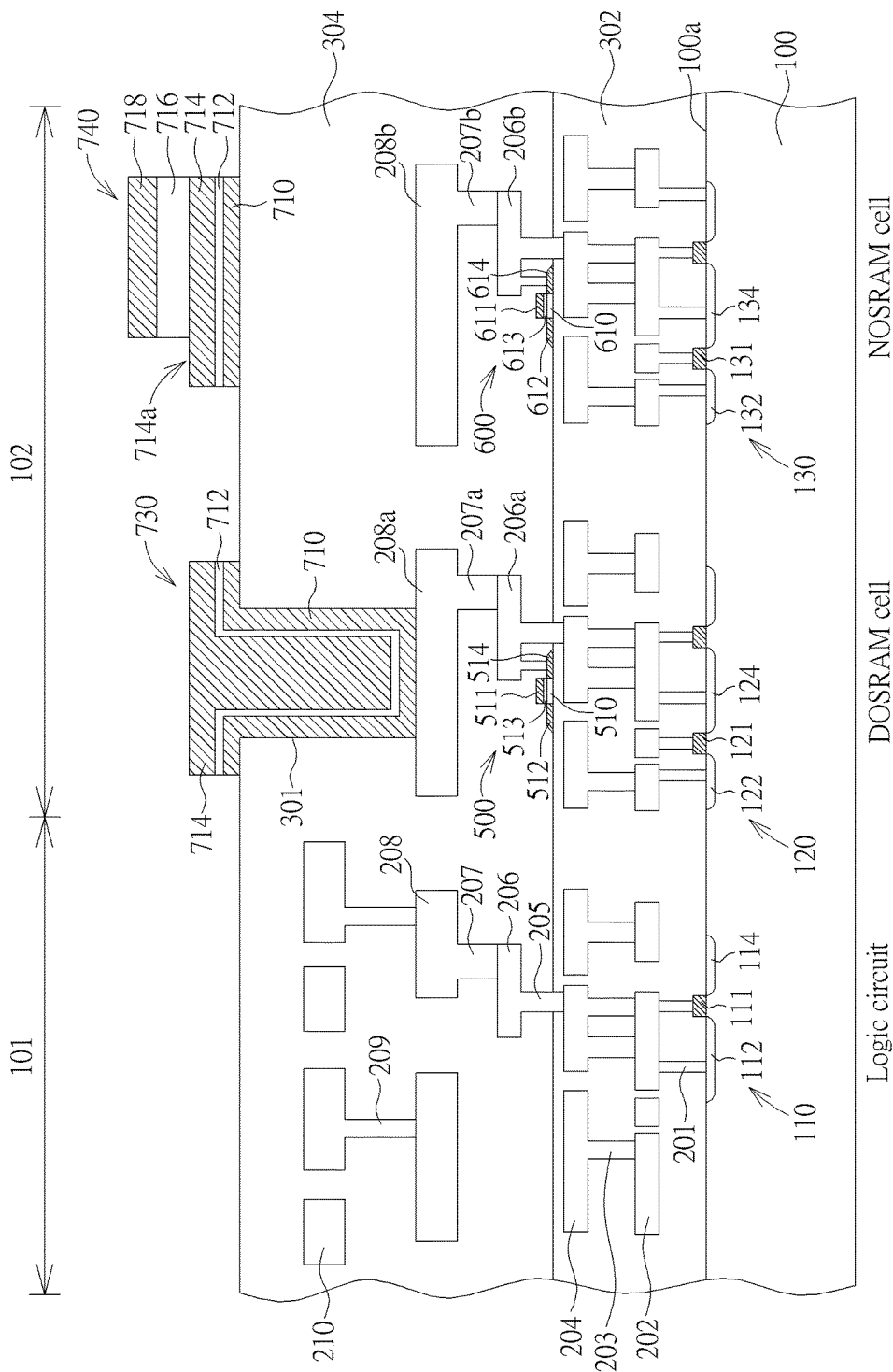

As shown in FIG. 8, another lithographic process and another etching process are carried out. The third metal layer 718 and the low-leakage dielectric layer 716 are removed from the capacitor pattern 730 to reveal the top surface of the second metal layer 714. A portion of the third metal layer 718 and a portion of the low-leakage dielectric layer 716 are removed from the capacitor pattern 740 to thereby expose a contact area 714a of the second metal layer 714.

Figure 9:
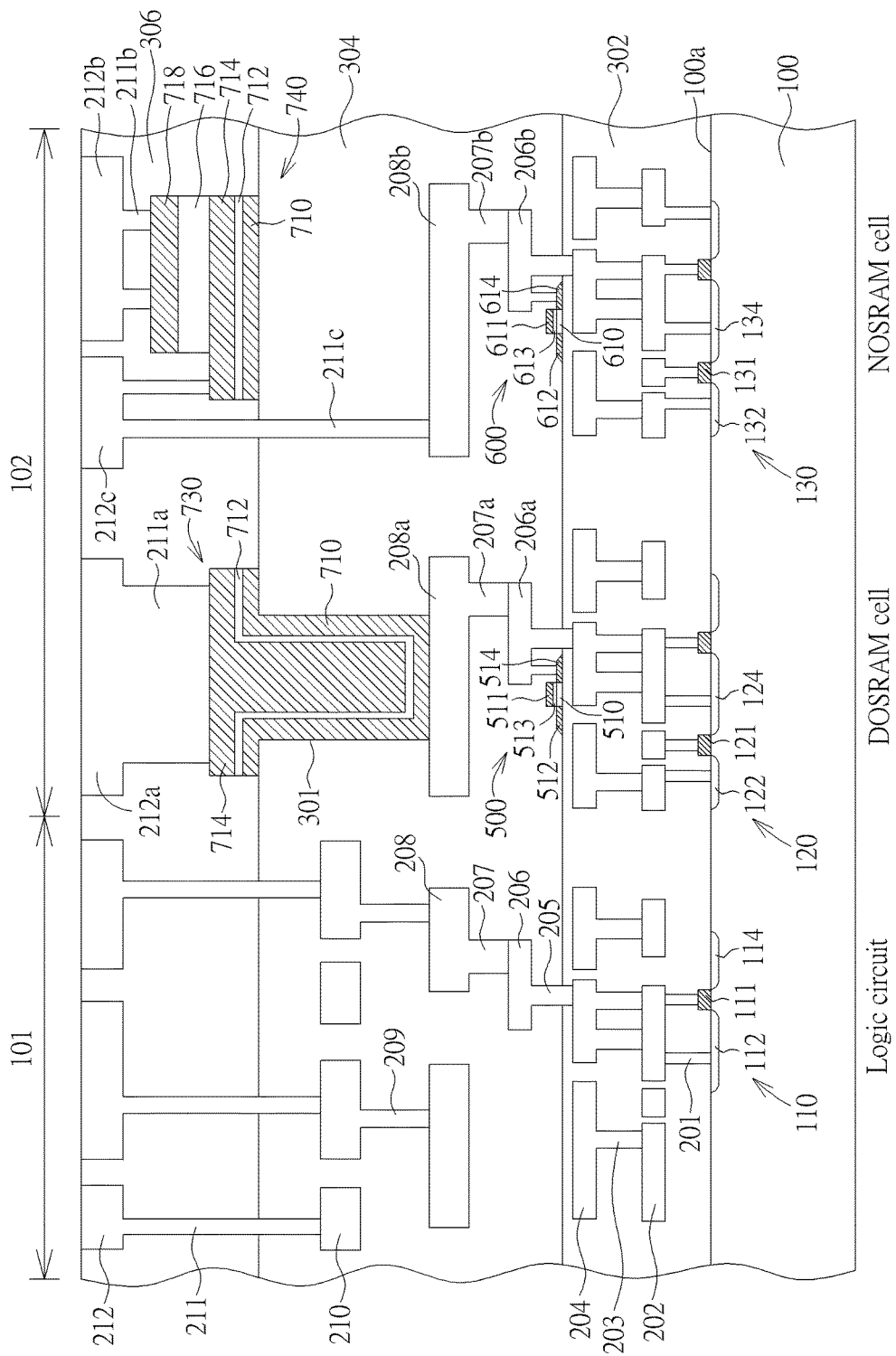

As shown in FIG. 9, a third dielectric layer 306 is deposited to cover the capacitor pattern 730, the capacitor pattern 740, and the second dielectric layer 304. The third dielectric layer 306 may comprise a single ILD film or multiple ILD films including, but not limited to, silicon oxide, silicon nitride, silicon oxynitride, PSG, BPSG, ultra-low k dielectric, etc. A plurality of metal interconnection features including, but not limited to, metal wiring layer 212 and via plugs 211, are formed within the third dielectric layer 306. According to the embodiment of the invention, the metal wiring layer 212 and via plugs 211 may be formed by copper damascene techniques, but not limited thereto.

According to the embodiment of the invention, the second metal layer 714 of the capacitor pattern 730 functions as the capacitor top plate of a DOSRAM cell, which may be electrically connected to a metal wiring layer 212a through a via plug 211a. According to the embodiment of the invention, the third metal layer 718 of the capacitor pattern 740 functions as the capacitor top plate of a NOSRAM cell, which may be electrically connected to a metal wiring layer 212b through a via plug 211b. The second metal layer 714, the high-k dielectric layer 712, and the first metal layer 710 together function as a capacitor bottom plate of the NOSRAM cell, which may be electrically coupled to an OS FET device through at least the metal layer 212c and the via plug 211c.

Please refer to FIG. 10 to FIG. 14, and briefly to FIG. 4. FIG. 10 to FIG. 14 are schematic, cross-sectional diagrams showing an exemplary method for fabricating the semiconductor memory device 1a in FIG. 2 according to another embodiment of the invention. The process step described in FIG. 10 follows the process step described in FIG. 4.

Figure 10:
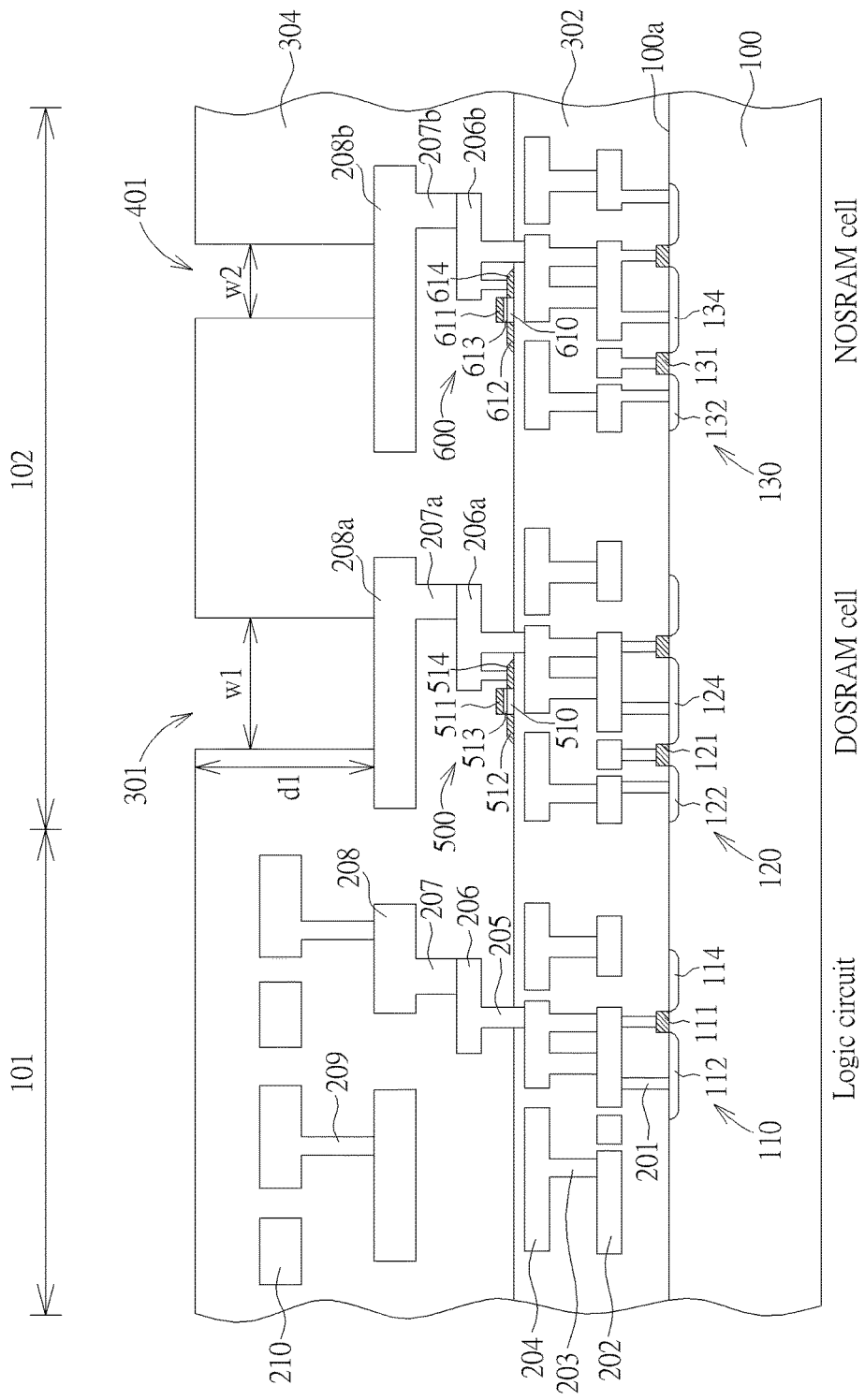
FIG. 10 to FIG. 14 are schematic, cross-sectional diagrams showing an exemplary method for fabricating the semiconductor memory device depicted in FIG. 2 according to another embodiment of the invention.

As shown in FIG. 10, after the formation of the first and second OS FET devices 500, 600 and the deposition of the second dielectric layer 304 as described in FIG. 4, a capacitor trench 301 and a capacitor trench 401 are formed in the second dielectric layer 304 within the memory region 102. The capacitor trench 301 and capacitor trench 401 may be formed by using lithographic processes and etching processes known in the art. The capacitor trench 301 partially exposes a top surface of the metal layer 208a. The capacitor trench 401 partially exposes a top surface of the metal layer 208b. According to the embodiment of the invention, the capacitor trench 301 may have a width $w_1$ that is greater than the width $w_2$ of the capacitor trench 401.

Figure 11:
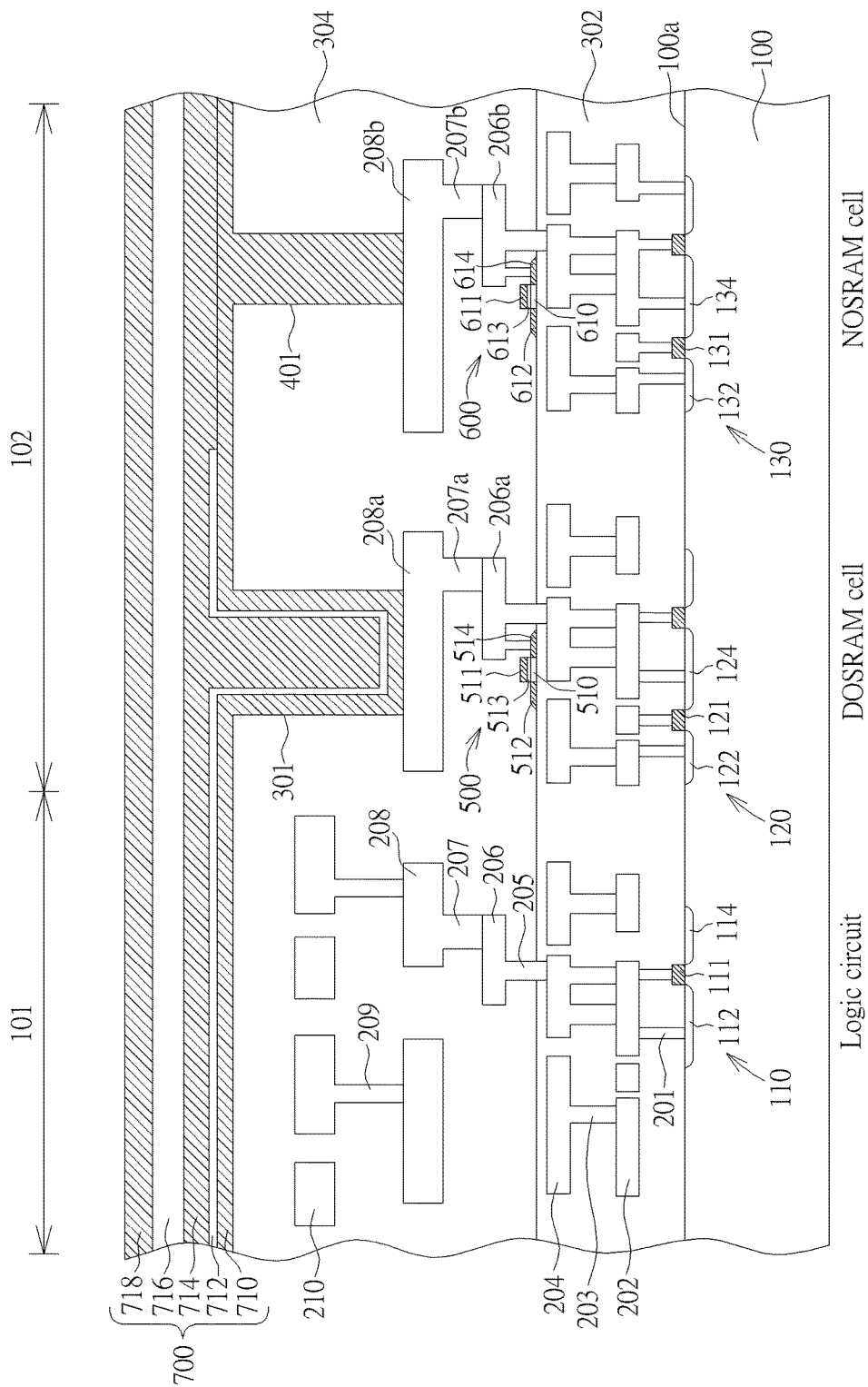

As shown in FIG. 11, a capacitor film stack 700 is formed. For example, a first metal layer 710 is conformally deposited on the second dielectric layer 304 and in the capacitor trenches 301 and 401. The first metal layer 710 may comprise TiN or W, but not limited thereto. The first metal layer 710 may be formed by atomic layer deposition (ALD), chemical vapor deposition (CVD), or any suitable methods.

According to the embodiment of the invention, the capacitor trench 301 is partially filled with the first metal layer 710, while the capacitor trench 401 is completely filled with the first metal layer 710.

Subsequently, a high-k dielectric layer 712 may be conformally deposited on the first metal layer 710. For example, the high-k dielectric layer 712 may comprise $Al_2O_3$, $HfO_x$, $ZrO_x$, $BaTiO_x$, or $ZrO_2$—$Al_2O_3$—$ZrO_2$ (ZAZ), but not limited thereto. Subsequently, a portion of the high-k dielectric layer 712 may be removed from the NOSRAM cell region by using conventional lithographic processes and etching processes.

Subsequently, a second metal layer 714 is deposited on the high-k dielectric layer 712. For example, the second metal layer 714 may comprise TiN or W, but not limited thereto. The second metal layer 714 may be formed by ALD, CVD, or any suitable methods. According to the embodiment of the invention, the second metal layer 714 may be in direct contact with the first metal layer 710 within the NOSRAM cell region.

According to the embodiment of the invention, the first metal layer 710, the high-k dielectric layer 712, and the second metal layer 714 completely fill up the capacitor trench 301. A low-leakage dielectric layer 716 is then deposited on the second metal layer 714. The low-leakage dielectric layer 716 may comprise $SiO_2$, SiON, SiN, or ONO, but not limited thereto. A third metal layer 718 is deposited on the low-leakage dielectric layer 716. For example, the third metal layer 718 may comprise TiN or W, but not limited thereto. The third metal layer 718 may be formed by ALD, CVD, or any suitable methods.

Figure 12:
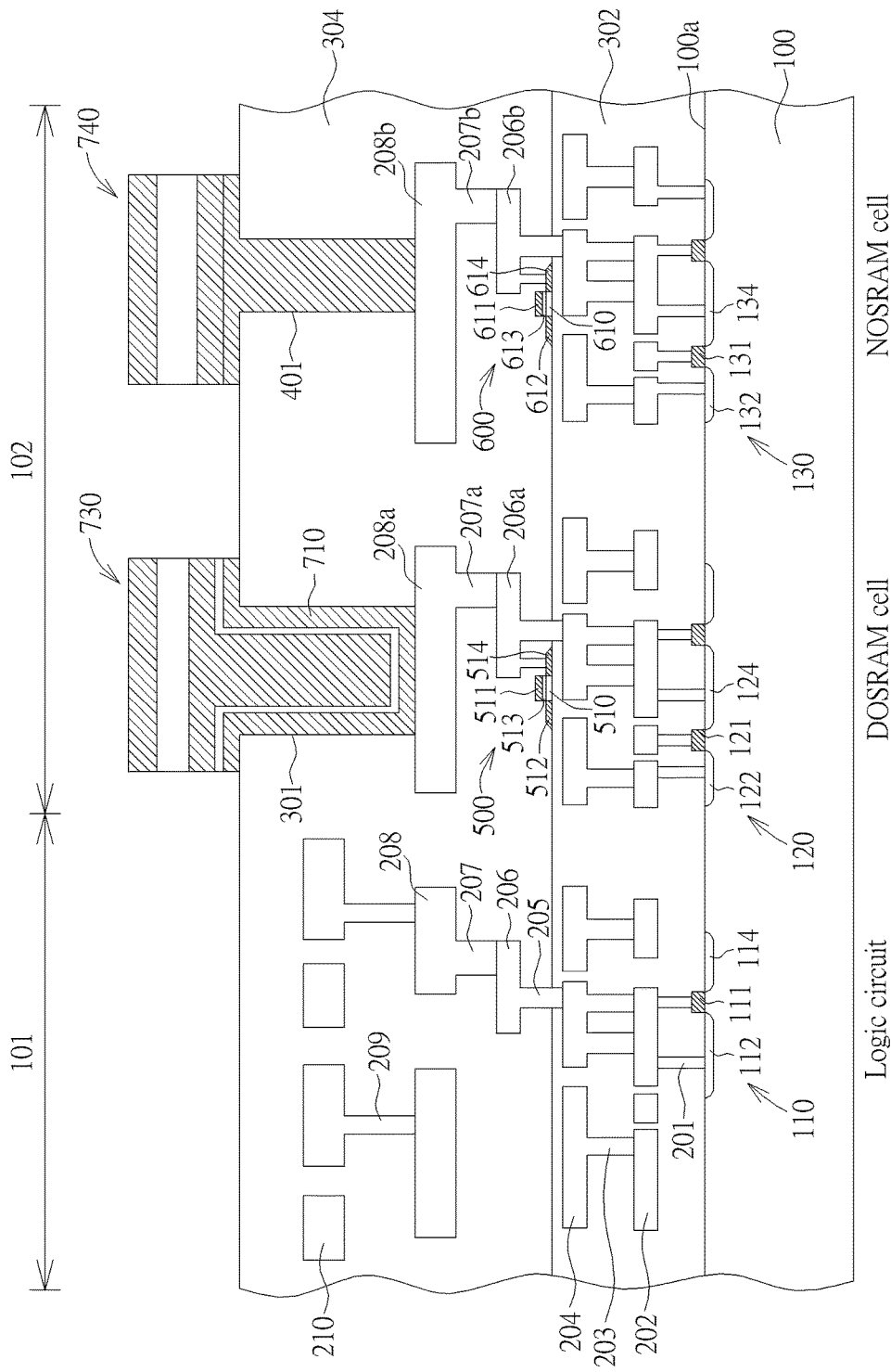

As shown in FIG. 12, a lithographic process and an etching process are carried out. A portion of the capacitor film stack 700 is removed to thereby form capacitor pattern 730 and capacitor pattern 740 on the second dielectric layer 304 within the memory region 102.

Figure 13:
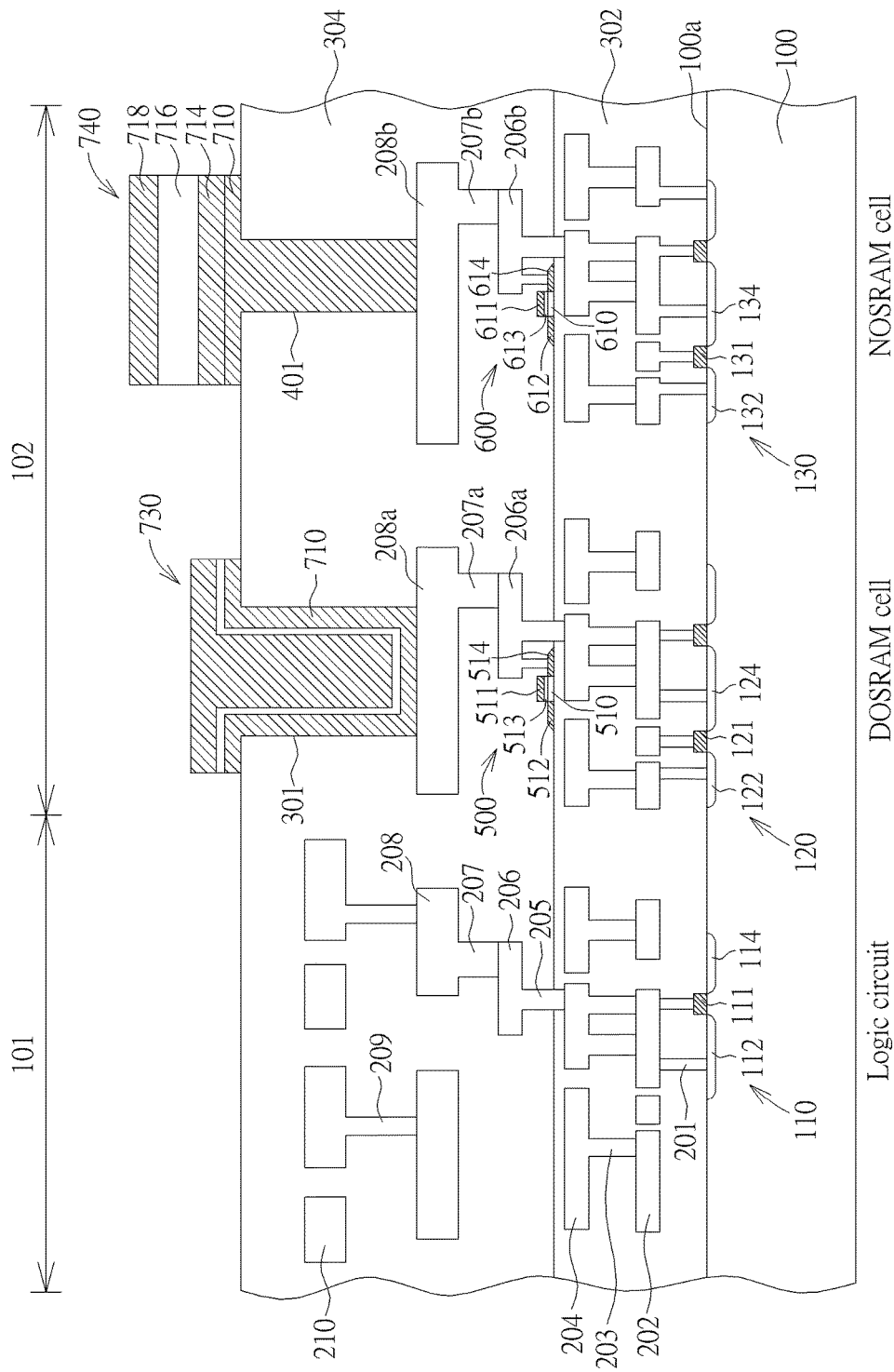

As shown in FIG. 13, another lithographic process and another etching process are carried out. The third metal layer 718 and the low-leakage dielectric layer 716 are removed from the capacitor pattern 730 to reveal the top surface of the second metal layer 714.

Figure 14:
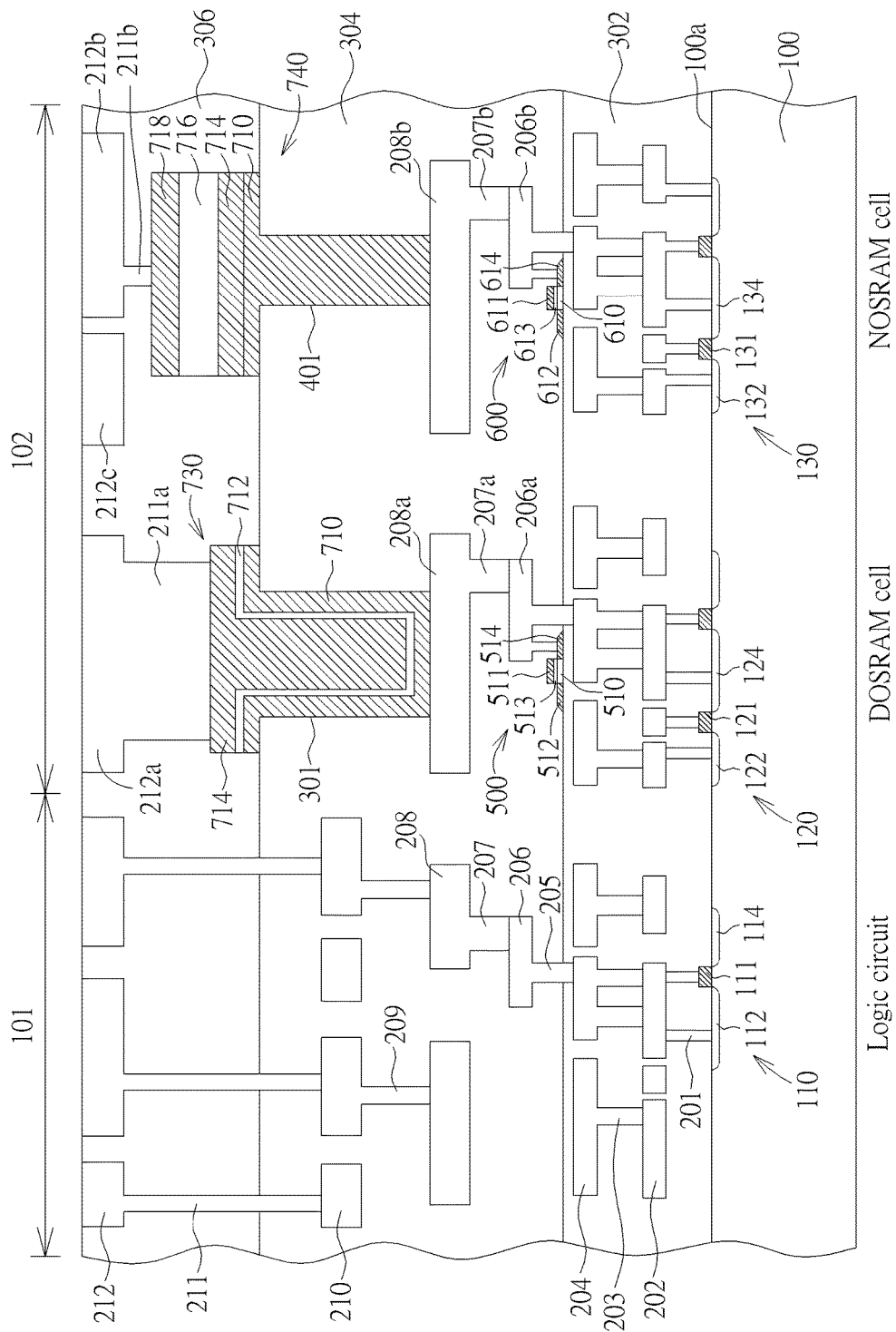

As shown in FIG. 14, a third dielectric layer 306 is deposited to cover the capacitor pattern 730, the capacitor pattern 740, and the second dielectric layer 304. The third dielectric layer 306 may comprise a single ILD film or multiple ILD films including, but not limited to, silicon oxide, silicon nitride, silicon oxynitride, PSG, BPSG, ultra-low k dielectric, etc. A plurality of metal interconnection features including, but not limited to, metal wiring layer 212 and via plugs 211, are formed within the third dielectric layer 306. According to the embodiment of the invention, the metal wiring layer 212 and via plugs 211 may be formed by copper damascene techniques, but not limited thereto.

According to the embodiment of the invention, the second metal layer 714 of the capacitor pattern 730 functions as the capacitor top plate of a DOSRAM cell, which may be electrically connected to a metal wiring layer 212a through a via plug 211a. According to the embodiment of the invention, the third metal layer 718 of the capacitor pattern 740 functions as the capacitor top plate of a NOSRAM cell, which may be electrically connected to a metal wiring layer 212b through a via plug 211b.

An exemplary method for fabricating the semiconductor memory device 1b in FIG. 3 according to another embodiment of the invention is similar to the exemplary method for fabricating the semiconductor memory device 1 in FIG. 1, differs in that two capacitor trenches having similar width are formed within the memory region 102. Please refer to FIGS. 6 to 7, two similar capacitor patterns 730 may be formed within the DOSRAM cell region and the NOSRAM cell region, respectively. Subsequent process steps are omitted since they are the same as the exemplary method for fabricating the semiconductor memory device 1 in FIG. 1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a semiconductor substrate having a main surface;
at least a first dielectric layer on the main surface of the semiconductor substrate;
a first oxide semiconductor field effect transistor (OS FET) device disposed on the first dielectric layer;
a second OS FET device disposed on the first dielectric layer;
at least a second dielectric layer covering the first dielectric layer, the first OS FET device, and the second OS FET device;
a first metal-insulator-metal (MIM) capacitor on the second dielectric layer and electrically coupled to the first OS FET device, thereby constituting a dynamic oxide semiconductor random access memory (DOSRAM) cell, wherein the first MIM capacitor comprises a first bottom plate (BP) in a first capacitor trench, a first high-k dielectric layer on the first BP, and a first top plate (TP) on the first high-k dielectric layer; and
a second MIM capacitor on the second dielectric layer and electrically coupled to the second OS FET device, thereby constituting a non-volatile oxide semiconductor random access memory (NOSRAM) cell.

2. The semiconductor memory device of claim 1, wherein the first OS FET device or the second OS FET device comprises a gate electrode, a source electrode, and a drain electrode, wherein the gate electrode traverses a channel material layer.

3. The semiconductor memory device of claim 2, wherein the channel material layer comprises an oxide semiconductor (OS) material layer, wherein the oxide semiconductor material layer comprises In—Ga—Zn oxide (IGZO) or c-axis aligned crystalline oxide semiconductor (CAAC-OS) materials.

4. The semiconductor memory device of claim 1 further comprising at least a metal-oxide-semiconductor field-effect-transistor (MOS FET) device disposed on and in the main surface of the semiconductor substrate.

5. The semiconductor memory device of claim 1, wherein the high-k dielectric layer comprises $Al_2O_3$, $HfO_x$, $ZrO_x$, $BaTiO_x$, or $ZrO_2$—$Al_2O_3$—$ZrO_2$ (ZAZ).

6. The semiconductor memory device of claim 1, wherein the second MIM capacitor comprises a second BP on the second dielectric layer, a low-leakage dielectric layer on the second BP, and a second TP on the low-leakage dielectric layer.

7. The semiconductor memory device of claim 6, wherein the low-leakage dielectric layer comprises $SiO_2$, SiON, SiN, or ONO.

8. The semiconductor memory device of claim 6, wherein the second BP comprises an electrically floating first metal layer, a second high-k dielectric layer on the first metal layer, and a second metal layer on the second high-k dielectric layer.

9. The semiconductor memory device of claim 6, wherein the second BP is disposed in a second capacitor trench.

* * * * *